(12) United States Patent
Tuma

(10) Patent No.: US 9,072,345 B2
(45) Date of Patent: Jul. 7, 2015

(54) CONTACT CLOSURE COMPONENT

(75) Inventor: Jan Tuma, Herrenberg (DE)

(73) Assignee: Gottlieb Binder GmbH & Co. KG, Holzergerlingen (DE)

( * ) Notice: Subject to any disclaimer, the term of this patent is extended or adjusted under 35 U.S.C. 154(b) by 228 days.

(21) Appl. No.: 13/261,573

(22) PCT Filed: Jul. 8, 2011

(86) PCT No.: PCT/EP2011/003426
§ 371 (c)(1),
(2), (4) Date: Jan. 24, 2013

(87) PCT Pub. No.: WO2012/031290
PCT Pub. Date: Feb. 2, 2012

(65) Prior Publication Data
US 2013/0125353 A1    May 23, 2013

(30) Foreign Application Priority Data

Jul. 30, 2010 (DE) .................. 10 2010 032 855

(51) Int. Cl.
*A44B 18/00* (2006.01)
*B81B 1/00* (2006.01)
*C09J 7/00* (2006.01)

(52) U.S. Cl.
CPC .......... *A44B 18/0088* (2013.01); *Y10T 24/27* (2015.01); *A44B 18/0065* (2013.01); *A44B 18/0069* (2013.01); *B81B 1/008* (2013.01); *C09J 7/00* (2013.01); *C09J 2201/626* (2013.01)

(58) Field of Classification Search
CPC . Y10T 24/27; Y10T 24/2792; A44B 18/0065

USPC ................... 428/100, 99; 24/442, 452
See application file for complete search history.

(56) References Cited

U.S. PATENT DOCUMENTS

| 5,797,170 A | 8/1998 | Akeno | |
| 5,813,095 A * | 9/1998 | Robertson | ............ 24/442 |

FOREIGN PATENT DOCUMENTS

| DE | 100 39 937 A1 | 3/2002 |
| DE | 10 2004 016 627 A2 | 11/2005 |
| DE | 698 27 297 T2 | 2/2006 |
| DE | 10 2006 024 014 A1 | 11/2007 |
| DE | 602 25 862 T2 | 4/2009 |
| DE | 10 2009 006 358 A1 | 7/2010 |
| WO | WO 97/13981 A1 | 4/1997 |
| WO | WO 01/49776 A2 | 7/2001 |
| WO | WO 2008/102621 A1 | 8/2008 |

* cited by examiner

*Primary Examiner* — Alexander Thomas
(74) *Attorney, Agent, or Firm* — Roylance, Abrams, Berdo & Goodman LLP

(57) ABSTRACT

A contact closure component (10) includes a carrier part (12) and closure parts (14a-14b) arranged upright on the carrier part. Each closure part (14a-14b) has at least one stem part (10a-20b) having a pre-definable longitudinal extent ($H_s$). At least one shaping section (26a-26b) is formed on at least one stem part (20a-20b), in at least one length section (24a-24b). The shaping section is set back at least partially with respect to an imaginary stem outer shape, in the direction of the interior of the stem. At least one shaping section (26a-26b) permits elastic deformation and/or movement longitudinally and/or transversely with respect to the longitudinal extent ($H_s$) of the respective stem part (20a-20b).

14 Claims, 2 Drawing Sheets

CONTACT CLOSURE COMPONENT

FIELD OF THE INVENTION

The invention relates to a contact closure component, comprising a backing part and fastener parts. The fastener parts are arranged in an upright manner on the backing part, with each fastener part having at least one stem part having a pre-definable longitudinal extent.

BACKGROUND OF THE INVENTION

WO 01/49776 A2 discloses such a touch-and-close fastener part, in which the free ends of the stem parts of the individual fastener parts are provided with a plurality of individual fibers. The diameter of the respective fibers is chosen to be very thin, so that the free end of each individual fiber has only a very small contact surface ranging from 0.2 to 0.5 $\mu m^2$. That magnitude enables an interaction with a second component in the vicinity, to which the second component of the touch-and-close fastener part is to be attached by van der Waals interaction constituting in classical terms a subgroup of adhesion. According to the teaching of WO 01/49776 A2, parts of the foot structure of a gecko are used directly as biological material or are artificially simulated, with such an adhesive structure being a plurality of spatula components. Each spatula is divided into a plurality of individual filaments in the form of a curved, conically expanding fastener part at the free end.

The touch-and-close fastener part known from the prior art exhibits good connecting properties, but is associated with a cost-intensive production process. With this known solution from the prior art, the formation of detachable adhesive connections can be made that are configured for a broader range of materials and have a higher adhesion capacity. The possibility exists of providing the specified holding forces or holding properties. However, due to the relatively rigid arrangement between the head parts and the backing part by the stem parts, which stem parts are arranged such that they may be tilted and room for improved solutions exists.

SUMMARY OF THE INVENTION

An object of the present invention is to improve the flexibility of the touch-and-close fastener part with respect to a wide range of adhesion requirements, as well as to enhance the adhesion capacity.

This object is basically achieved according to the invention by a touch-and-close fastener part having at least one shaping section provided on at least one stem part in at least one longitudinal section. The shaping section is set back at least partially with respect to an imaginary outer shape of the stem part in the direction of the interior of the stem. The at least one shaping section allows at least the stem part to be able to deform and/or move in an elastic manner along and/or transversely to the longitudinal extent of the respective stem part. The corresponding fastener part can be adapted to the second component in an improved way, in particular, in such a way that the fastener part forms a larger active contact surface and adheres to this second component. By removing or cutting out the material in the region of the respective shaping section, free spaces are created in which or, more specifically, inside of which the respective stem part can be moved. For example, the stem part is expanded or compressed, and is moved in an axial and/or radial direction in a rotational and/or linear movement.

In a preferred embodiment of the inventive touch-and-close fastener part, the at least one shaping section is configured to extend at least partially as a necking, tapering, and/or notch along the periphery and/or along the longitudinal extent of the corresponding stem part. Preferably, the shaping section extends along or about the entire periphery of the stem part. The respective shaping section can also extend along the entire longitudinal extent of the corresponding stem part. Shaping sections that extend in a radial direction perpendicular to the longitudinal extent of the respective stem part have the advantage that identical, or, in other words, homogeneous deformation and/or movement properties of the respective stem part can be set in all (radial) directions.

Advantageously, the necking, tapering, and/or notch is/are arranged and/or configured to extend at regular intervals along and/or perpendicular to the longitudinal extent of the corresponding stem part. In addition to a simple mode of production, this configuration has the advantage of direction-independent, homogeneous properties of the respective stem part. The formation and arrangement of the respective shaping section is chosen according to the desired properties of the respective stem part. For example, one or more preferred directions for the elastic deformation or rather movement of the respective stem part can be set, in particular, can be adjusted to a peeling movement when the touch-and-close fastener part is used as intended.

Advantageously, the respective necking, tapering, and/or notch exhibit/exhibits the same depth and/or define/defines the same width of the stem part in a direction perpendicular to the longitudinal extent of the corresponding stem part. The stem parts are typically configured in the form of a cylinder, but can also have tapering regions and/or expansion regions. If a plurality of shaping sections form a bellows-shaped longitudinal section, then the identical depth of the corresponding neckings along the longitudinal extent permits achieving homogeneous deformation properties or, more specifically, movement properties. This structure largely avoids an overload with the associated damage of a defined location of the stem part during deformation or more specifically during a movement.

In an additional advantageous embodiment of the touch-and-close fastener part according to the invention, the fastener parts are constructed to be rotationally symmetrical at least in the region of the stem parts and/or at least in the region of at least one shaping section. The rotational symmetry relates to the central axis of the respective stem part, which extends parallel to the longitudinal extent of the respective stem part. Rotationally symmetrical fastener parts are invariant relative to spatially different arrangements or, more specifically, orientations of the touch-and-close fastener part and can be arranged on the substrate part in any radial orientation because the fastener parts exhibit rotationally invariant deformation and/or movement properties. In this context, the configurations of the stem part and/or the head part having an n-cornered shape must also be considered to be rotationally symmetrical when the configuration is identical.

Advantageously, the fastener parts are constructed to have the same shape at least in the region of at least one shaping section and/or at least in the region of the stem part. In addition, the fastener parts can be arranged in at least one surface section of the backing part, while simultaneously forming a regular pattern. This arrangement affords the advantage of homogeneous properties of a backing part populated with fastener parts. In addition, making the backing part in one piece with the fastener parts is practical. To produce the touch-and-close fastener part according to the invention, a plastic material containing most preferably polyvinyl siloxane can be used and machined, in particular, by microreplication technology.

In a preferred embodiment of the touch-and-close fastener part, at least one fastener part has a head part, wherein the respective head part has a contact surface on its free face side for releasably adhering to a second component by adhesion force. The respective head part is typically designed in the form of a mushroom. Preferably, the respective shaping section is constructed in the region of the head part and/or adjacent to the head part. The shaping sections allow the head parts to be decoupled to a certain extent from any movement of the respectively assignable stem part. A kind of damping is then achieved that ensures to a greater extent that the contact surface will remain on the second component, even if there is a relative movement between the stem part and the assignable head part up to a specified limit load.

Furthermore, the respective stem part can extend between the head part and a base part, with the respective fastener part being connected to the backing part by the base part. Even more highly preferred, the shaping section(s) is/are arranged in the region of the entire longitudinal extent of the respective stem part. The longitudinal extent of the respective stem part typically amounts to 100 μm; and/or the width of the respective stem part typically ranges from 30 to 40 μm.

Preferably, the stem parts stand in each instance substantially vertically on the backing part; and the contact surfaces defined by the respective head parts extend more or less parallel to the backing part. In particular, the contact surfaces are arranged such that they lie in a common plane when the stem parts have the same shape. It is important in this case that the individual stem parts or rather the fastener parts, including the head parts, have the same longitudinal extent, when seen from the flat surface of the backing part. The second component can also be replaced with a third component.

Other objects, advantages and salient features of the present invention will become apparent from the following detailed description, which, taken in conjunction with the annexed drawings, discloses preferred embodiments of the present invention

BRIEF DESCRIPTION OF THE DRAWINGS

Referring to the drawings that form a part of this disclosure and that are schematic and not to scale.

DETAILED DESCRIPTION OF THE INVENTION

Figure 1:
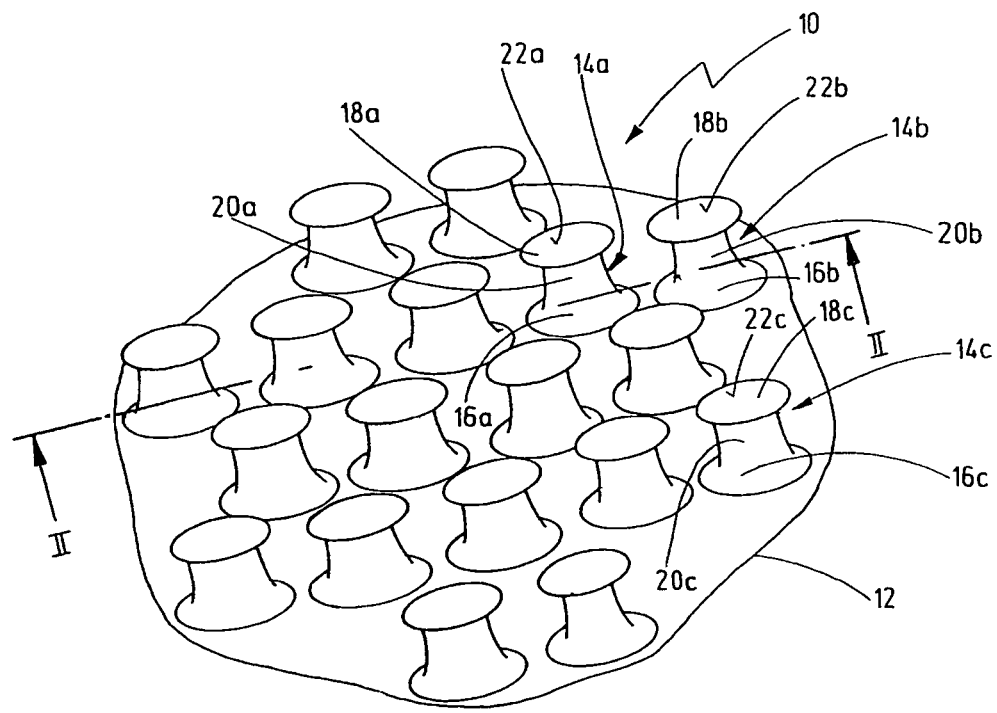
FIG. 1 is a perspective view of a touch-and-close fastener part with a plurality of fastener parts according to an exemplary embodiment of the invention.

FIG. 1 shows a touch-and-close fastener part 10 comprising a flat backing part 12 and fastener parts 14a-14c arranged at regular intervals on the backing part. Each fastener part comprises a base part 16a-16c and a head part 18a-18c. A stem part 20a-20c extends between the head parts 18a-18c. The base parts 16a-16c connect the respective fastener parts 14a-14c to the backing part 12. Each face-side end of the head parts 18a-18c has a circular, flat contact surface 22a-22c used for the adhesive engagement with a second component (not illustrated). Since all of the fastener parts 14a-14c have the same shape, the contact surfaces 22a-22c lie in a plane parallel to the backing surface 12.

Figure 2:
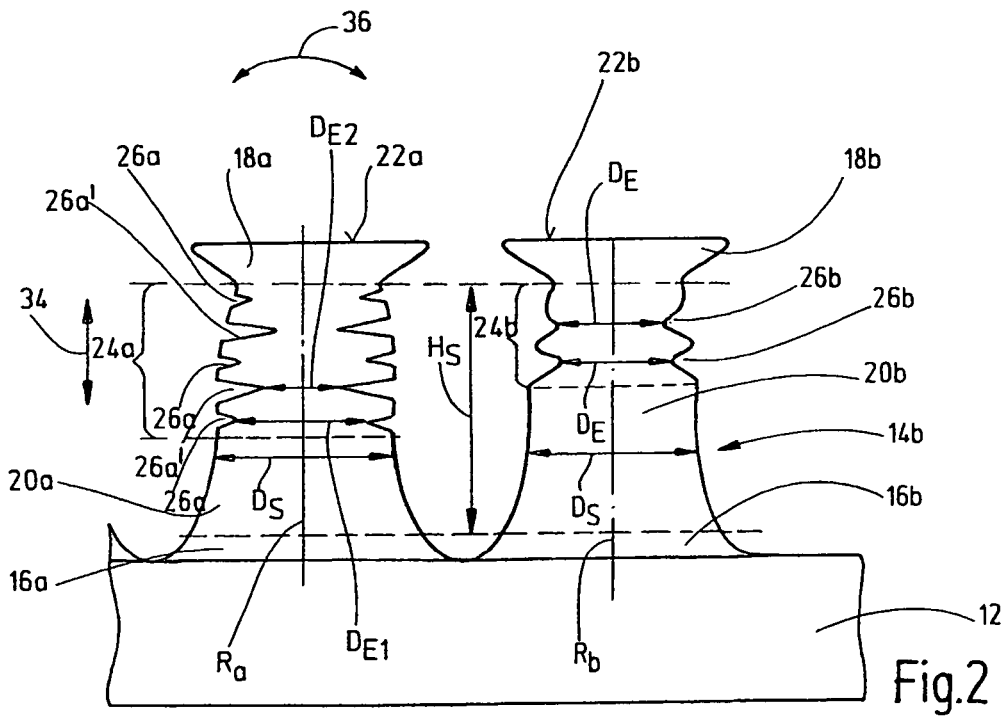
FIG. 2 is a side elevational view in section of two fastener parts shown in FIG. 1 taken along line II-II of FIG. 1.

A detailed drawing of the fastener parts 14a and 14b is shown in FIG. 2. Both fastener parts 14a, 14b have neckings 26a-26b in a longitudinal section 24a, 24b adjacent to the respective head part 18a, 18b. In the case of the fastener part 14a (shown on the left), the neckings 26a, 26a' are set apart from each other at regular intervals along a longitudinal extent $H_S$ of the stem part 20a, but exhibit different notch depths in the radial direction perpendicular to the longitudinal extent $H_S$. The neckings 26a define a thickness $D_{E1}$ of the stem part 20a that is greater than the thickness $D_{E2}$ in the region of the deeper neckings 26a'.

The rest of the stem part 20a or, more specifically, its outer shape is defined by the stem diameter $D_S$. The two fastener parts 14a, 14b exhibit the greatest width in the region of the respective base part 16a, 16b. A first movement direction 34 and a second movement direction 36 of the fastener part 14a are indicated with corresponding arrows. Both fastener parts 14a, 14b are rotationally symmetrical relative to the central axis $R_a$, $R_b$ of the respective stem part 20a, 20b.

Two neckings 26b are shown in the fastener part 14b shown on the right in FIG. 2. These neckings are arranged in the axial direction parallel to the longitudinal extent $H_S$ and in the radial direction perpendicular to the longitudinal extent $H_S$ such that these neckings exhibit the same shape, are formed over the whole of the periphery of the stem part 20b and define the thickness $D_E$ of the stem part 20b. FIG. 2 show very clearly the arrangement of the two contact surfaces 22a and 22b in a common plane parallel to the plane of the backing part 12.

Figure 3:
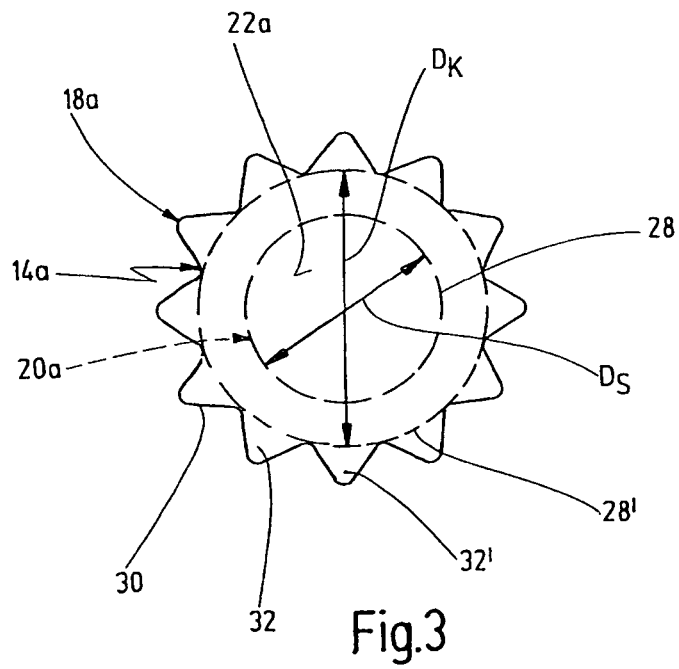
FIG. 3 is a top view of a fastener part shown in FIGS. 1 and 2.

FIG. 3 is a top view of the head part 18a of the corresponding fastener part 14a, where the stem part 20a is indicated by an inner circular line 28 having a diameter $D_S$. The head part 18a, projecting beyond the stem part 20a in the radial direction, is designed substantially in the shape of a circle on the contact surface 22a, so that the head part conforms to an outer circular line 28' having a diameter $D_K$. The edge of the head part has a wavy outer contour with teeth 32, 32'. The teeth 32, 32' produce tear-off edges that improve the adhesive fastening properties of the touch-and-close fastener part 10 with the fastener part 14a.

Figure 4:
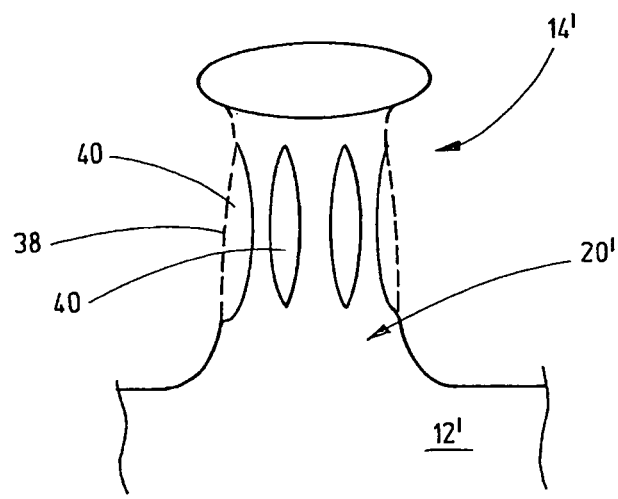
FIG. 4 is a side elevational view of a touch-and-close fastener part according to another exemplary embodiment of the invention.

FIG. 4 is a side view of an additional fastener part 14 arranged on a backing 12'. In this case, the notches 40 are configured to extend in the axial extent along the longitudinal extent of the stem part 20'. These notches are set back with respect to an outer shape 38 in the direction of the interior of the stem part 20'. Owing to the notches 40, the fastener part 14' can be rotated and/or moved about the central axis of the stem part 20' and/or the fastener part 14' shown to be rotationally symmetrical in this case. Additional embodiments of one or more shaping sections at the individual fastener parts are conceivable. In particular, fastener parts having a different shape can be provided on a backing part. Expediently, the shaping sections are formed on the fastener parts during the production of said fastener parts. A backing part can be optimally populated, as required, with suitably designed fastener parts, whereby a touch-and-close fastener part is made accordingly.

In order to produce the respective touch-and-close fastener part, conventional forming methods can be used, such as the chill roll method. Furthermore, microlithographic or nanolithographic methods, including micro printing, can be used. In addition or optionally, the described microstructure can also be achieved with a kind of crystal growth. Moreover, the fastener material can also be generated from solids, for example, with the use of micro spark erosion or a corresponding laser beam cutting process.

While various embodiments have been chosen to illustrate the invention, it will be understood by those skilled in the art that various changes and modifications can be made therein without departing from the scope of the invention as defined in the appended claims.

What is claimed is:

1. A touch-and-close fastener part, comprising:
   a backing part;
   fastener parts arranged in an upright manner on said backing part, each said fastener part having at least one stem part with a pre-definable longitudinal extent and having a head part with a contact surface on a free face side thereof releasably adherable to a second component by an adhesive force; and
   a plurality of shaping sections in at least one longitudinal section of each said stem part, each said shaping section being inwardly set back at least partially relative to an imaginary outer shape of said stem part and extending at least partially along a circumference of said stem part, each said shaping section allowing the respective stem part to deform in an elastic manner along and transversely to said longitudinal extent thereof.

2. A touch-and-close fastener part according to claim 1 wherein
   each said shaping section comprises at least one of a necking, tapering, or notch.

3. A touch-and-close fastener part according to claim 2 wherein
   each said at least one of necking, tapering or notch is configured and arranged to extend at regular intervals along and perpendicular to said longitudinal extent of the respective stem part.

4. A touch-and-close fastener part according to claim 2 wherein
   each said at least one of necking, tapering or notch exhibits a same depth defining a same width of the respective stem parts in a direction perpendicular to said longitudinal extent thereof.

5. A touch-and-close fastener part according to claim 2 wherein
   each said at least one of said necking, tapering or notch extends completely about a cross-sectional circumference of the respective stem part in a plane perpendicular to the longitudinal extent thereof.

6. A touch-and-dose fastener part according to claim 1 wherein
   said plurality of shaping sections in each said stem part are in a bellows form in the respective longitudinal section thereof.

7. A touch-and-close fastener part according to claim 1 wherein
   each said fastener part is rotationally symmetrical at least in a region of at least in one of the respective stem parts thereof or shaping sections thereof.

8. A touch-and-close fastener part according to claim 1 wherein
   each said fastener part has a same shape at least in a region of at least in one of the respective shaping sections or stem part.

9. A touch-and-close fastener part according to claim 1 wherein
   each said stem part extends between the respective head part and a base part thereof connected to said backing part connecting the respective stem part to said backing.

10. A touch-and-close fastener part according to claim 1 wherein
    the respective longitudinal extent of each said stem part is about 100 μm, with a width of about 30 to 40 μm.

11. A touch-and-close fastener part according to claim 1 wherein
    said stem part is on a side of said head part opposite said free face side of the respective fastener part.

12. A touch-and-close fastener part according to claim 1 wherein
    each said shaping section on each said stem part is defined by two oppositely directed frustoconical surfaces.

13. A touch-and-close fastener part according to claim 1 wherein
    said contact surface is planar.

14. A touch-and-close fastener part, comprising:
    a backing part;
    fastener parts arranged in an upright manner on said backing part, each said fastener part having at least one stem part with a pre-definable longitudinal extent and having a head part with a contact surface on a free face side thereof releasably adherable to a second component by an adhesive force; and
    a plurality of shaping sections in at least one longitudinal section of each said stem part, each said shaping section being inwardly set back at least partially relative to an imaginary outer shape of said stem part an extending at least partially along a circumference of said stem part, each said shaping section allowing the respective stem part to deform in an elastic manner along and transversely to said longitudinal extent thereof, each of said shaping sections being in a region of the respective stem part adjacent the respective head part.

* * * * *